US008571159B1

(12) United States Patent
Soh

(10) Patent No.: US 8,571,159 B1
(45) Date of Patent: Oct. 29, 2013

(54) APPARATUS AND METHODS FOR HIGH-SPEED INTERPOLATOR-BASED CLOCK AND DATA RECOVERY

(75) Inventor: Lip Kai Soh, Sitiawan (MY)

(73) Assignee: Altera Corporation, San Jose, CA (US)

( * ) Notice: Subject to any disclaimer, the term of this patent is extended or adjusted under 35 U.S.C. 154(b) by 51 days.

(21) Appl. No.: 13/310,513

(22) Filed: Dec. 2, 2011

(51) Int. Cl.
*H04L 7/00* (2006.01)

(52) U.S. Cl.
USPC ............................ 375/354; 375/355; 341/122

(58) Field of Classification Search
USPC ................. 375/354, 355, 371, 229, 230, 232; 341/122, 123
See application file for complete search history.

(56) References Cited

U.S. PATENT DOCUMENTS

| | | | | |
|---|---|---|---|---|
| 6,573,940 | B1 * | 6/2003 | Yang | 348/441 |
| 7,680,232 | B2 | 3/2010 | Shumarayev et al. | |
| 7,839,177 | B1 | 11/2010 | Soh | |
| 2002/0085656 | A1 * | 7/2002 | Lee et al. | 375/355 |
| 2005/0238093 | A1 * | 10/2005 | Payne et al. | 375/224 |
| 2009/0254292 | A1 * | 10/2009 | Wegener | 702/77 |
| 2010/0091927 | A1 | 4/2010 | Walker et al. | |
| 2011/0249519 | A1 * | 10/2011 | Tamura | 365/189.15 |
| 2012/0039426 | A1 * | 2/2012 | Onodera | 375/355 |

OTHER PUBLICATIONS

J.Sonntag and R. Leonowich, "A Monolithic CMOS 10 MHz DPLL for Burst-Mode Data Retiming", Feb. 16, 1990, pp. 194-195, ISSCC 90, Continental Ballroom 1-4, IEEE International Solid-State Circuits Conference.

Thomas H. Lee et al., "A 2.5 V CMOS Delay-Locked Loop for 18 Mbit, 500 Megabyte/s DRAM", Dec. 1994, pp. 1491-1496, IEEE Journal of Solid-State Circuits, vol. 29, No. 12.

S. Sidiropoulos and M. Horowitz, "A Semidigital Dual Delay-Locked Loop", Nov. 1997, pp. 1683-1692, IEEE Journal of Solid-State Circuits, vol. 32, No. 11.

J. Savoj and B. Razavi, "A 10-Gb/s Clock and Data Recovery Circuit with a Half-Rate Linear Phase Detector", May 2001, pp. 761-768, IEEE Journal of Solid-State Circuits, vol. 36, No. 5.

J. Savoj and B. Razavi, "A 10-Gb/s Clock and Data Recovery Circuit with a Half-Rate Binary Phase/Frequency Detector", Jan. 2003, pp. 13-21, IEEE Journal of Solid-State Circuits, vol. 38, No. 1.

M. Rau et al., "Clock/Data Recovery PLL Using Half-Frequency Clock", Jul. 1997, pp. 1156-1159, IEEE Journal of Solid-State Circuits, vol. 32, No. 7.

R. Kreienkamp et al., "A 10-Gb/s CMOS Clock and Data Recovery Circuit with an Analog Phase Interpolator", 2003, pp. 73-76, IEEE Custom Integrated Circuits Conference.

Pavan Kumar Hanumolu, et al., "A Wide-Tracking Range Clock and Data Recovery Circuit", Feb. 2008, pp. 425-439, IEEE Journal of Solid-State Circuits, vol. 43. No. 2.

J.D.H. Alexander, "Clock Recovery from Random Binary Signals", Sep. 26, 1975, pp. 541-542, Electronic Letters, Dept. of Engineering, University of Aberdeen, Aberdeen AB9 1AS, Scotland.

* cited by examiner

*Primary Examiner* — Dac Ha
(74) *Attorney, Agent, or Firm* — Okamoto & Benedicto LLP

(57) ABSTRACT

One embodiment relates to an interpolator-based clock and data recovery circuit which includes a de-multiplexer and a voting circuit. The de-multiplexer is arranged to de-multiplex a feedback signal from a sampler, and the voting circuit is arranged decimate the de-multiplexed feedback signal. The decimated feedback signal may be provided to a digital filter. Another embodiment relates to a method for clock and data recovery from a data signal. The method includes de-multiplexing and decimation of a feedback signal. Other embodiments and features are also disclosed.

16 Claims, 7 Drawing Sheets

APPARATUS AND METHODS FOR HIGH-SPEED INTERPOLATOR-BASED CLOCK AND DATA RECOVERY

BACKGROUND

1. Technical Field

The present invention relates generally to data communications. More particularly, the present invention relates to circuitry for high-speed data links.

2. Description of the Background Art

High-speed data links are used to communicate data between devices in a system. Serial interface protocols have been developed at increasingly fast data rates for such high-speed links. Examples of industry-standard protocols for serial interfaces include PCI Express® (Peripheral Component Interconnect Express), XAUI (X Attachment Unit Interface), sRIO (serial Rapid IO), and others.

Market demands for transceiver data rates for high-speed data links continue to increase. In recent years, the demanded increase in transceiver data rates has exceeded gains based on process improvements alone. As such, improvements in transceiver design are also needed to provide the desired increases in speed.

SUMMARY

One embodiment relates to an interpolator-based clock and data recovery circuit which includes a de-multiplexer and a voting circuit. The de-multiplexer is arranged to de-multiplex a feedback signal from a sampler, and the voting circuit is arranged decimate the de-multiplexed feedback signal. The decimated feedback signal may be provided to a digital filter. Another embodiment relates to a method for clock and data recovery from a data signal. The method includes de-multiplexing and decimation of a feedback signal. The feedback signal may also be digitally filtered. Other embodiments and features are also disclosed.

DETAILED DESCRIPTION

The present disclosure provides innovative architecture for a clock and data recovery (CDR) circuit. The CDR architecture enables substantially higher data rates than a conventional CDR design.

In addition to enabling faster speeds, the new architecture overcomes the problem of high random jitter at the output of a conventional CDR circuit. The random jitter occurs in a conventional CDR circuit due to the sampler circuit outputting randomly distributed early and late signals due to jitter at the edges of input data. This causes the sampling clock's phase to shift up and down (i.e. to dither between two adjacent phases) when the loop of the CDR circuit is in locked.

In accordance with an embodiment of the invention, a new architecture is disclosed which de-multiplexes the CDR sampler's output. The de-multiplexing may be accomplished by using de-multiplexer and majority voting circuitry.

Figure 1:
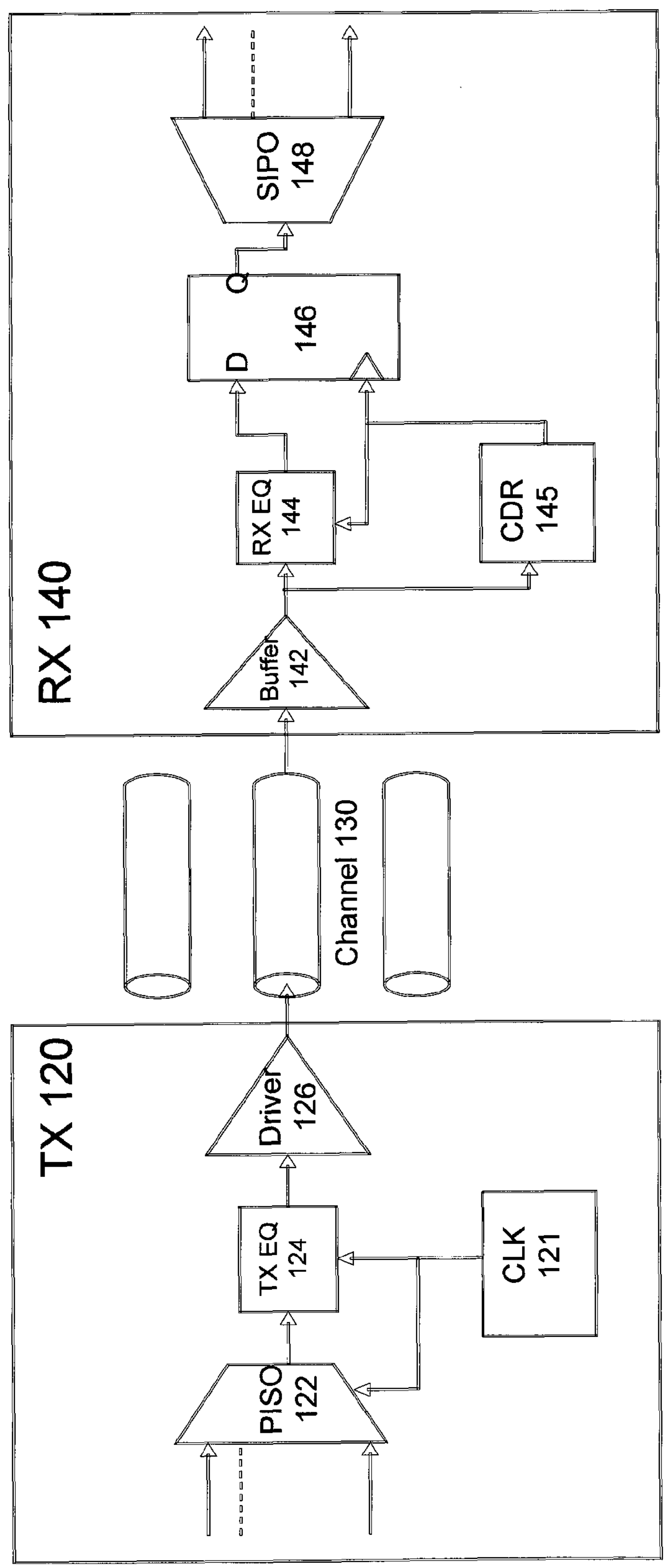
FIG. 1 is a high-level diagram of a communication link in accordance with an embodiment of the invention.

FIG. 1 is a high-level diagram of a communication link in accordance with an embodiment of the invention. As shown in FIG. 1, a communication link is generally composed of a transmitter (TX) 120, a receiver (RX) 140, and a communication channel (CH) 130 that is located in between the transmitter and the receiver.

The TX 120 may include a parallel-in-serial-out (PISO) circuit 122. The PISO (serializer) circuit 122 is configured to receive parallel data signals and convert it to a serial data signal. For example, the transmitter 120 may be part of an integrated circuit, and the parallel data signals may be provided by a communication protocol module in the integrated circuit.

The serial data signal may be adjusted by a transmitter equalizer (TX EQ) circuit 124. In one embodiment, the TX EQ circuit 124 may implement a finite impulse response (FIR) equalization that pre-distorts the transmitted signal to compensate for signal distortion in the channel 130. Clock generator (CLK) circuit 121 may utilize a phase locked loop (PLL) circuit to provide a clock signal to the PISO 122 and TX EQ 124 circuits. The output from the TX EQ 124 circuit may be provided to a driver circuit 126. The driver circuit 126 may be configured to transmit the serial data signal over the channel 130.

The channel 130 communicates the serial data signal from the transmitter 120 to the receiver 140. The channel 130 may use multiple lanes to communicate the serial data signal.

The receiver 140 may be configured to receive the transmitted serial data signal from the multiple-lane channel into buffer circuitry 142. The buffer circuitry 142 may output the received serial data signal to receiver equalization (RX EQ) circuit 144 and to the clock and data recovery (CDR) circuit 145. The RX EQ circuit 144 may be configured to perform one or more equalizations to compensate for high-frequency signal loss in the channel. The RX EQ circuit 144 may output an "equalized" serial data signal to a data input of a latch circuit 146.

In accordance with an embodiment of the invention, the CDR circuit 145 may use a high-speed interpolator-based CDR circuit architecture, as disclosed herein, to recover the clock signal from the serial data signal. The new circuit architecture and its operation are described in detail below.

The sampling clock may be provided from the CDR circuit 145 to clock inputs of the RX EQ circuit 144 and to a latch circuit 146. The latch circuit 146 may be configured to receive the equalized serial data signal from the RX EQ circuit 144 at its data input and to receive the sampling clock from the CDR circuit 145 at its clock input. The latch circuit 146 outputs the regenerated serial data signal to a serial-in-parallel-out (SIPO) circuit 148. The SIPO (serializer) circuit 148 is configured to receive a serial data signal and convert it to parallel data signals. The parallel data signals may be provided to other circuitry of the receiving device. For example, the receiving device may be an integrated circuit, and the parallel data signals may be provided to a communication protocol module in the integrated circuit.

Figure 2:
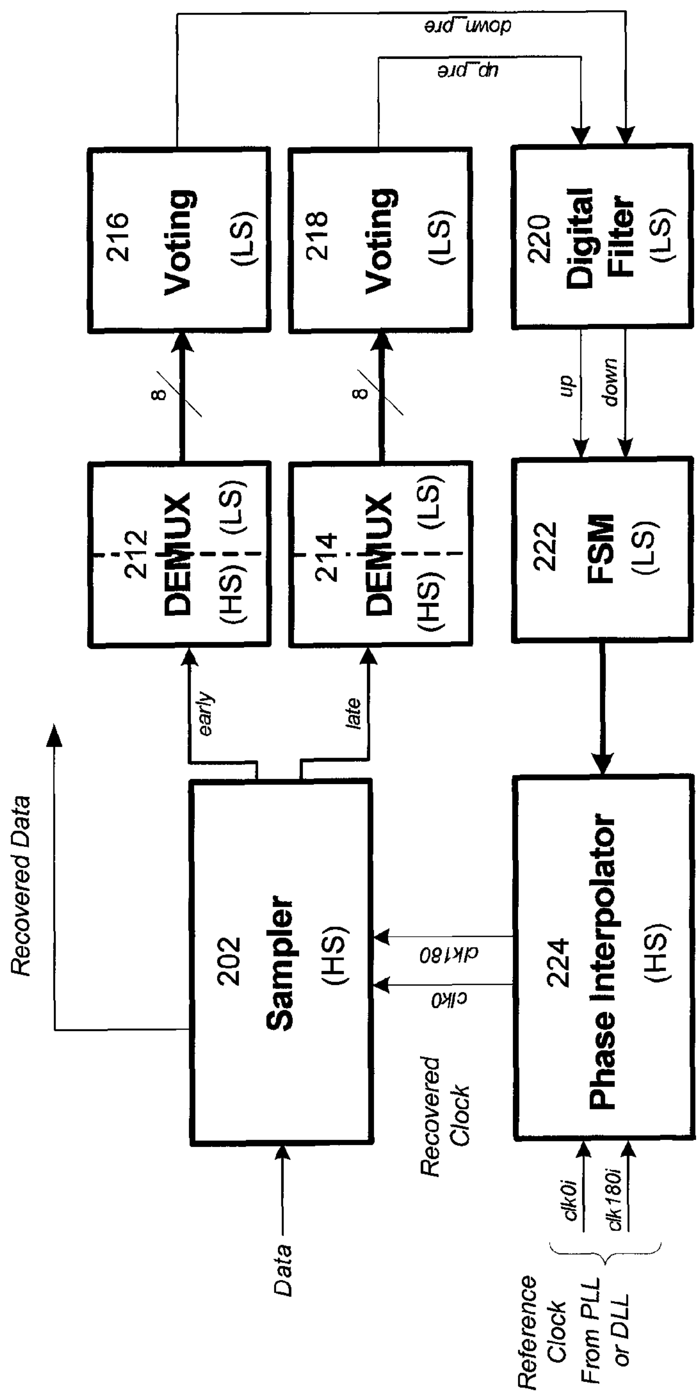
FIG. 2 depicts a clock and data recovery circuit in accordance with an embodiment of the invention.

FIG. 2 depicts an interpolator-based clock data recovery (CDR) circuit 200 in accordance with an embodiment of the invention. As shown, the CDR circuit 200 includes a circuit loop that is formed by a sampler (phase detector) circuit 202, a de-multiplexer (DEMUX) circuit 212-214, a majority voting circuit 216-218, a digital filter circuit 220, a finite state machine (FSM) circuit 222, and a phase interpolator circuit 224.

The sampler circuit 202 may be configured to receive an incoming serial data signal (the input data signal) that may be at a data rate of X gigabits per second. The sampler circuit 202 may be configured to sample the input data signal to determine the position of a sampling clock with respect to the input data signal. The sampling clock may be generated by the phase interpolator circuit 224. As shown in FIG. 2, the sampling clock may include two clock signals, shown as clk0 and clk180, which have a phase difference of 180 degrees (π radians) between them. If the sampling clock is leading the input data signal, then an early signal may be asserted (set to high); and, if the sampling clock is lagging the input data signal, then a late signal may be asserted (set to high). The early and late signals together may be referred to as the feedback signal.

In a conventional interpolator-based CDR circuit, the feedback signal is provided to a digital filter. Typically, the digital filter may be an N-bit binary counter. In contrast, in accordance with an embodiment of the invention, the feedback signals from the sampler circuit 202 are received by the DEMUX circuit which includes the two DEMUX circuit blocks 212 and 214. As shown in FIG. 2, the first DEMUX circuit block 212 may be arranged to receive the early signal from the sampler circuit 202 and de-multiplex it into parallel signals, and the second DEMUX circuit block 214 may be arranged to receive the late signal and de-multiplex it into parallel signals. The de-multiplexing effectively reduces the speed of the feedback signal. The resultant parallel signals may be referred to as the de-multiplexed feedback signal. As further indicated in FIG. 2, each DEMUX circuit block (212/214) includes higher-speed (HS) circuitry which receives the early or late signal from the sampler circuit 202 and lower-speed (LS) circuitry which outputs the parallel signals which form the corresponding de-w multiplexed feedback signal.

In accordance with an embodiment of the invention, the DEMUX circuit (212-214) may be programmable (configurable). The programmable aspect of the DEMUX circuit (212-214) is described further below in relation to FIG. 4.

The de-multiplexed feedback signal may be received by the voting circuit which includes the two voting circuit blocks 216 and 218. In particular, as shown in FIG. 2, the first voting circuit block 216 may be arranged to receive the de-multiplexed early signal from the first DEMUX circuit block 212, and the second voting circuit block 218 may be arranged to receive the de-multiplexed late signal from the second DEMUX circuit block 214. The voting circuit (216-218) advantageously decimates the de-multiplexed feedback signal and outputs a decimated feedback signal. The decimated feedback signal may include a "preliminary" down (down_pre) signal from the first voting circuit block 216 and a "preliminary" up (up_pre) signal from the second voting circuit block 218.

In accordance with an embodiment of the invention, the voting circuit (216-218) may be programmable. The programmable aspect of the voting circuit (216-218) is described further below in relation to FIG. 4.

The decimated feedback signal may be received by the digital filter circuit 220. The digital filter circuit 220 may be arranged to compensate for the latency of the CDR loop and to further reduce loop dithering. The digital filter circuit 220 may generate a filtered version of the decimated feedback signal (i.e. a filtered feedback signal). The filtered feedback signal may include a down signal which is the filtered version of the down_pre signal and an up signal which is the filtered version of the up_pre signal. The digital filter circuit 220 may be programmable to a plurality of filter settings.

The filtered feedback signal may be received by the FSM circuit 222. The FSM circuit 222 may be arranged to generate an interpolator control signal based on the filtered version of the decimated feedback signal. The interpolator control signal may control the phase interpolator 224 to shift the phase of the sampling clock up or down or to maintain (i.e. not shift) the current phase of the sampling clock. If the sampling clock is consistently early (leading) with respect to the input data signal, then the FSM circuit 222 will receive a down signal and will control the phase interpolator 224 to shift down the phase of the sampling clock. On the other hand, if the sampling clock is consistently late (lagging) with respect to the input data signal, then the FSM circuit 222 will receive an up signal and will control the phase interpolator 224 to shift up the phase of the sampling clock.

The phase interpolator circuit 224 may be arranged to receive a reference clock and generate the sampling clock. The reference clock may be received from a phase locked loop (PLL) or a delay locked loop (DLL) circuit. As shown in FIG. 2, the reference clock may include two clock signals, shown as clk0*i* and clk180*i*, which have a phase difference of 180 degrees (π radians) between them. The phase interpolator circuit 224 may generate the clock signals of sampling clock by interpolation of the clock signals of the reference clock. The phase resolution of the sampling clock may be determined by the resolution at which the phase interpolator circuit 224 is capable of interpolating between the clock signals of the reference clock.

Figure 3:
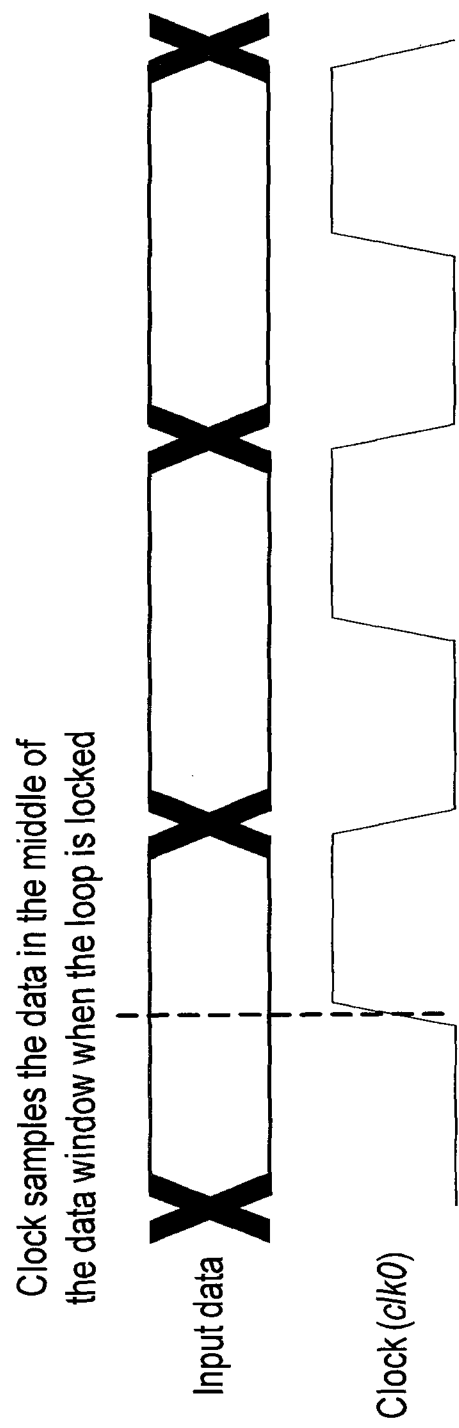
FIG. 3 depicts a lock state of the clock and data recovery circuit in accordance with an embodiment of the invention.

The CDR circuit 200 may adjust the phase of the sampling clock until the sampling clock signal clk0 samples the input data signal at the middle of the data window between edges of the input data signal. This state of the CDR circuit 200 may be referred to as the lock state. The lock state is depicted in FIG. 3.

Figure 4:
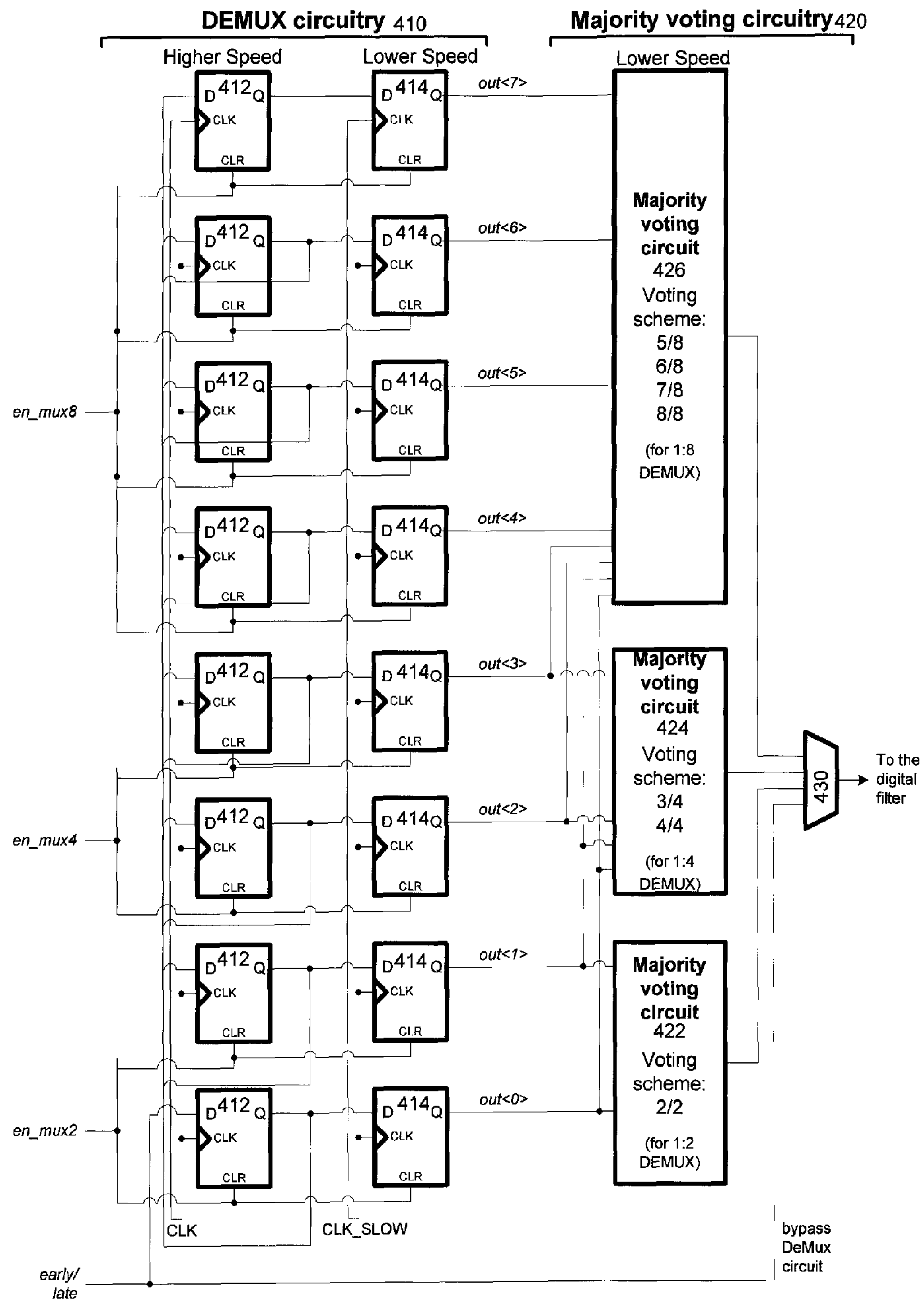
FIG. 4 depicts de-multiplexer and majority voting circuitry in accordance with an embodiment of the invention.

FIG. 4 depicts de-multiplexer and majority voting circuitry 400 in accordance with an embodiment of the invention. As shown, the circuitry 400 includes a DEMUX circuitry 410 and a majority voting circuitry 420.

The circuitry 400 in FIG. 4 may be used to implement the first DEMUX circuit block 212 and the first voting circuit block 216. In other words, the DEMUX circuitry 410 may be used to implement the first DEMUX circuit block 212, and the majority voting circuitry 420 may be used to implement the first voting circuit block 216. In this case, the early signal may be input into the circuitry 400.

The circuitry 400 in FIG. 4 may also be used to implement the second DEMUX circuit block 214 and the second voting circuit block 218. In other words, the DEMUX circuitry 410 may be used to implement the second DEMUX circuit block 214, and the majority voting circuitry 420 may be used to implement the second voting circuit block 218. In this case, the late signal may be input into the circuitry 400.

As shown in FIG. 4, the DEMUX circuitry 410 may include a cascade of higher-speed flip-flops 412 which effectively forms a shift register. The data outputs of each higher-speed flip-flop 412 is provided to the data input of an associated lower-speed flip-flop 414. More generally, in other implementations, the flip-flops 412-414 may be replaced by appropriately configured latches. The higher-speed flip-flops (or latches) 412 may be arranged such that their clock (CLK) input receives a higher-speed clock (CLK) signal, and the lower-speed flip-flops (or latches) 414 may be arranged such that their clock (CLK) input receives a lower-speed clock (CLK_SLOW) signal.

A plurality of enable signals may be used to configure the DEMUX circuitry 410. Each enable signal may be connected to a clear (CLR) input of a subset of the flip-flops 412-414 in the DEMUX circuitry 410. In the embodiment depicted in FIG. 4, there are three enable signals: en_mux2; en_mux4; and en_mux8. The en_mux2 signal is provided to the clear input of a first pair of higher-speed flip-flops 412 and a first pair of lower-speed flip-flops 414. The en_mux4 signal is provided to the clear input of a second pair of higher-speed flip-flops 412 and a second pair of lower-speed flip-flops 414. The en_mux8 signal is provided to the clear input of third and fourth pairs of higher-speed flip-flops 412 and third and fourth pairs of lower-speed flip-flops 414.

The DEMUX circuitry 410 shown in FIG. 4 may be configured using the enable signals to operate in one of three modes: a 1:2 de-multiplexing mode, a 1:4 de-multiplexing mode, and a 1:8 de-multiplexing mode. To configure the DEMUX circuitry 410 to operate in the 1:2 de-multiplexing mode, the en_mux2 signal may be set to logical one while the en_mux4 and en_mux8 signals may be reset to logical zero. To configure the DEMUX circuitry 410 to operate in the 1:4 de-multiplexing mode, the en_mux2 and en_mux4 signals may be set to logical one while the en_mux8 signal may be reset to logical zero. To configure the DEMUX circuitry 410 to operate in the 1:8 de-multiplexing mode, the en_mux2, en_mux4, and en_mux8 signals may be set to logical one. More generally, in accordance with other embodiments of the invention, the DEMUX circuitry 212/214 may be arranged to be programmable to a plurality of 1-to-N de-multiplexer settings.

The majority voting circuitry 420 shown in FIG. 4 includes one majority voting circuit block for each operating mode of the DEMUX circuit 410. A first majority voting circuit block 422 is arranged to be used with the 1:2 de-multiplexing mode and so receives data signals from the first pair of lower-speed flip-flops 414. The first majority voting circuit block 422 may be arranged to implement a 2/2 voting scheme.

A second majority voting circuit block 424 is arranged to be used with the 1:4 de-multiplexing mode and so receives data signals from the first and second pairs of lower-speed flip-flops 414. The second majority voting circuit block 424 may be arranged to be configurable (programmable) so as to implement one of a plurality of voting schemes. The second majority voting circuit block 424 may implement a ¾ voting scheme in one configuration and may implement a 4/4 voting scheme in another configuration.

The numerator of the voting scheme refers to the number of early or late counts required in one slow clock cycle (CLK_SLOW) for the majority voting circuit block to output a preliminary down or up (down_pre or up_pre) signal to digital filter. The denominator of the voting scheme refers to the de-multiplexing factor used. The numerator should be greater than half the denominator. For example, the voting scheme of ¾ means that the input data is de-multiplexed by a factor of four, and, if three or more of the inputs are early or if three or more of the inputs are late, then the majority voting circuit will output a down_pre or up_pre signal, respectively.

A third majority voting circuit block 424 is arranged to be used with the 1:8 de-multiplexing mode and so receives data signals from the first through fourth pairs of lower-speed flip-flops 414. The third majority voting circuit block 426 may also be arranged to be configurable (programmable) so as to implement one of a plurality of voting schemes. The third majority voting circuit block 426 may implement a ⅝ voting scheme in a first configuration, a 6/8 voting scheme in a second configuration, a ⅞ voting scheme in a third configuration, and an 8/8 voting scheme in a fourth configuration.

A configurable selector circuit 430 may select one signal of a plurality of signals to be output. The plurality of signals may include an output from each of the majority voting circuit blocks and may also include feedback signal (either the early signal or the late signal) from the sampler circuit 202. In the 1:2 de-multiplexing mode, the output signal from the first majority voting block 422 may be selected. In the 1:4 de-multiplexing mode, the output signal from the second majority voting block 424 may be selected. In the 1:8 de-multiplexing mode, the output signal from the third majority voting block 426 may be selected. Finally, in a bypass mode, the feedback signal from the sampler circuit 202 may be selected.

The table below shows different settings for the DEMUX and majority voting circuits in accordance with one embodiment of the invention.

TABLE 1

| Data rates (X) | DEMUX settings | Majority voting settings |
|---|---|---|
| X < 3.125 Gb/s | Bypass | N/A |
| | 1:2 DEMUX | 2/2 Vote |
| | 1:4 DEMUX | 3/4 Vote |
| | | 4/4 Vote |
| | 1:8 DEMUX | 5/8 Vote |
| | | 6/8 Vote |
| | | 7/8 Vote |
| | | 8/8 Vote |
| 3. 125 Gb/s < X < 6.25 Gb/s | 1:2 DEMUX | 2/2 Vote |
| | 1:4 DEMUX | 3/4 Vote |
| | | 4/4 Vote |
| | 1:8 DEMUX | 5/8 Vote |
| | | 6/8 Vote |
| | | 7/8 Vote |
| | | 8/8 Vote |
| 6.25 Gb/s < X < 12.5 Gb/s | 1:4 DEMUX | 3/4 Vote |
| | | 4/4 Vote |
| | 1:8 DEMUX | 5/8 Vote |
| | | 6/8 Vote |
| | | 7/8 Vote |
| | | 8/8 Vote |
| X > 12.5 Gb/s | 1:8 DEMUX | 5/8 Vote |
| | | 6/8 Vote |
| | | 7/8 Vote |
| | | 8/8 Vote |

As shown in Table 1, the allowed settings may depend on the data rate (X) of the serial data signal. In the lowest speed range, the DEMUX circuit may be set to bypass, 1:2 DEMUX, 1:4 DEMUX, or 1:8 DEMUX. In the second to lowest speed range, the DEMUX circuit may be set to 1:2 DEMUX, 1:4 DEMUX, or 1:8 DEMUX. In the second to fastest speed range, the DEMUX circuit may be set to 1:4 DEMUX or 1:8 DEMUX. In the fastest speed range, the DEMUX circuit is set to 1:8 DEMUX. Advantageously, a de-multiplexing factor which is twice as large is capable of supporting a data rate which is twice as fast. The DEMUX ratio can be increased beyond the one shown in Table 1 for higher data rates. Depending on the process technology used, the data rates stated in Table 1 may vary. For example, the lowest speed range (3.125 Gb/s) may increase to 5 Gb/s if faster process technology is used.

Higher majority voting settings provide lower random jitter. This is because the higher demultiplexing factor increases the amount of decimation and the more stringent voting scheme causes the CDR circuit to be less susceptible to noise at the input data.

An example of how the DEMUX and voting circuitry substantially reduces random jitter is discussed below in relation to Tables 2 and 3. Dithering in the sampler clock's phase due to jitter in the input data for a conventional CDR (without the DEMUX and voting circuitry) is illustrated in Table 2. In contrast, Table 3 shows how the dithering is reduced or eliminated due to using the DEMUX and voting circuitry in accordance with an embodiment of the invention.

TABLE 2

| Time | Sampler's output | Digital filter's up counter | Digital filter's down counter | Sampling clock's phase |
|---|---|---|---|---|
| 1 | early | 1 | 0 | 0 |
| 2 | late | 1 | 1 | 0 |
| 3 | early | 2 | 1 | 0 |
| 4 | late | 2 | 2 | 0 |
| 5 | early | 3 | 2 | 0 |
| 6 | late | 3 | 3 | 0 |
| 7 | early | 4 | 3 | 0 |
| Counter reset and phase interpolator shift its clock phase | | | | 1 |
| 8 | late | 0 | 1 | 1 |
| 9 | early | 1 | 1 | 1 |
| 10 | late | 1 | 2 | 1 |
| 11 | early | 2 | 2 | 1 |
| 12 | late | 2 | 3 | 1 |
| 13 | early | 3 | 3 | 1 |
| 14 | late | 3 | 4 | 1 |
| Counter reset and phase interpolator shift its clock phase | | | | 0 |
| 15 | early | 1 | 0 | 0 |
| 16 | late | 1 | 1 | 0 |
| 17 | early | 2 | 1 | 0 |
| 18 | late | 2 | 2 | 0 |
| 19 | early | 3 | 2 | 0 |
| 20 | late | 3 | 3 | 0 |
| 21 | ealy | 4 | 3 | 0 |
| Counter reset and phase interpolator shift its clock phase | | | | 1 |

As shown in Table 2, when the CDR loop is locked, jitter at the rising and falling edges of the input data causes the sampling clock's phase to dither between two phases (0 and 1 in the table).

TABLE 3

| Time | Sampler's output | DEMUX + Majority voting (1:4 DEMUX with 3/4 voting scheme is used) | Digital filter's up counter | Digital filter's down counter | Sampling clock's phase |
|---|---|---|---|---|---|
| 1 | early | 0 | 0 | 0 | 0 |
| 2 | late | | 0 | 0 | 0 |
| 3 | early | | 0 | 0 | 0 |
| 4 | late | | 0 | 0 | 0 |
| 5 | early | 0 | 0 | 0 | 0 |
| 6 | late | | 0 | 0 | 0 |
| 7 | early | | 0 | 0 | 0 |
| 8 | late | | 0 | 0 | 0 |
| 9 | early | 0 | 0 | 0 | 0 |
| 10 | late | | 0 | 0 | 0 |
| 11 | early | | 0 | 0 | 0 |
| 12 | late | | 0 | 0 | 0 |
| 13 | early | 0 | 0 | 0 | 0 |
| 14 | late | | 0 | 0 | 0 |
| 15 | early | | 0 | 0 | 0 |
| 16 | late | | 0 | 0 | 0 |
| 17 | early | 0 | 0 | 0 | 0 |
| 18 | late | | 0 | 0 | 0 |
| 19 | early | | 0 | 0 | 0 |
| 20 | late | | 0 | 0 | 0 |

As shown in Table 3, when the CDR loop is locked, the sampling clock's phase is steady despite jitter in the input data. Advantageously, by reducing or eliminating the dithering in the sampling clock's phase, the CDR random jitter is substantially reduced using an embodiment of the invention in comparison to previous interpolator-based CDR designs.

In accordance with an embodiment of the invention, a very stable interpolator-based CDR with dithering of one or two phase steps may be achieved. Digital filter settings in accordance with Equation 1 ("best filter settings") below may be used to achieve dithering of one phase interpolator step or less. Digital filter settings in accordance with Equation 2 below ("next best filter settings") may be used to achieve dithering of two phase interpolator steps or less.

$$\frac{\Phi}{2t_{PPM}n_{demux}} \leq \text{best filter settings} \leq \frac{\Phi}{t_{PPM}n_{demux}} \quad \text{(Eq. 1)}$$

$$\frac{\text{feedback latency}}{n_{demux}} \leq \text{next best filter settings} \leq \frac{\Phi}{2t_{PPM}n_{demux}} \quad \text{(Eq. 2)}$$

where $\Phi$ is the phase interpolator step size, $t_{PPM}$ is the amount of drift in one unit interval (1UI) due to the difference between reference clock frequencies, and $n_{demux}$ is the de-multiplexing factor of the DEMUX circuit. From the above equations, we can observe that the filter settings are inversely proportional to the DEMUX settings. Hence, when the DEMUX is used, lower filter settings for the digital filter 220 may be used.

Figure 5:
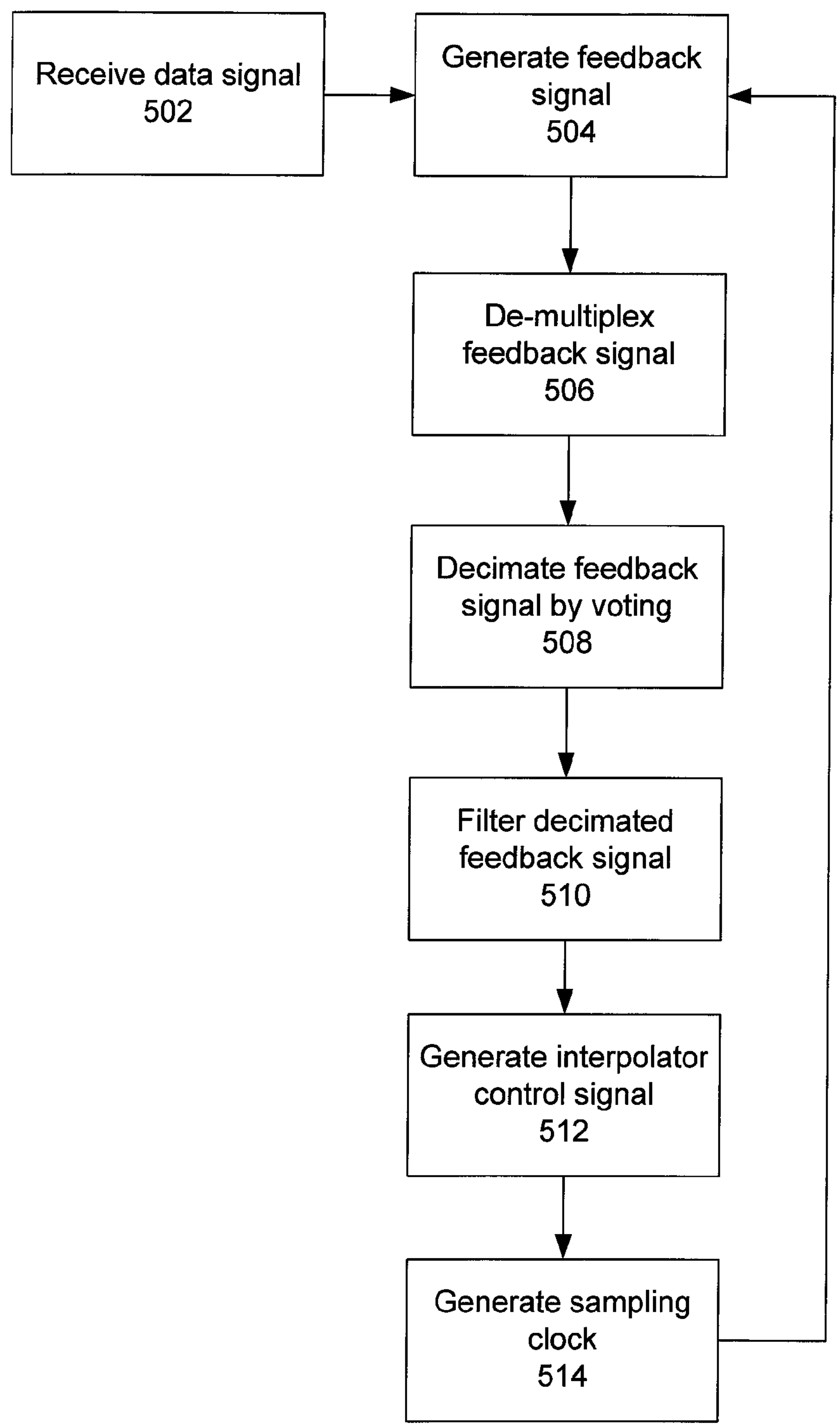
FIG. 5 is a flow chart of a method for clock and data recovery in accordance with an embodiment of the invention.

FIG. 5 is a flow chart of a method for clock and data recovery in accordance with an embodiment of the invention. As shown, the method 500 includes receiving 502 a data signal, and generating 504 a feedback signal which is responsive to a phase of the data signal relative to a sampling clock signal. The feedback signal is de-multiplexed 506 and decimated 508 by voting. The decimated feedback signal may then be filtered 510. An interpolator control signal may be generated 512 using the filtered feedback signal and a finite state machine. Finally, the sampling clock may be generated 514 by interpolation using a reference clock and the interpolator control signal.

Figure 6:
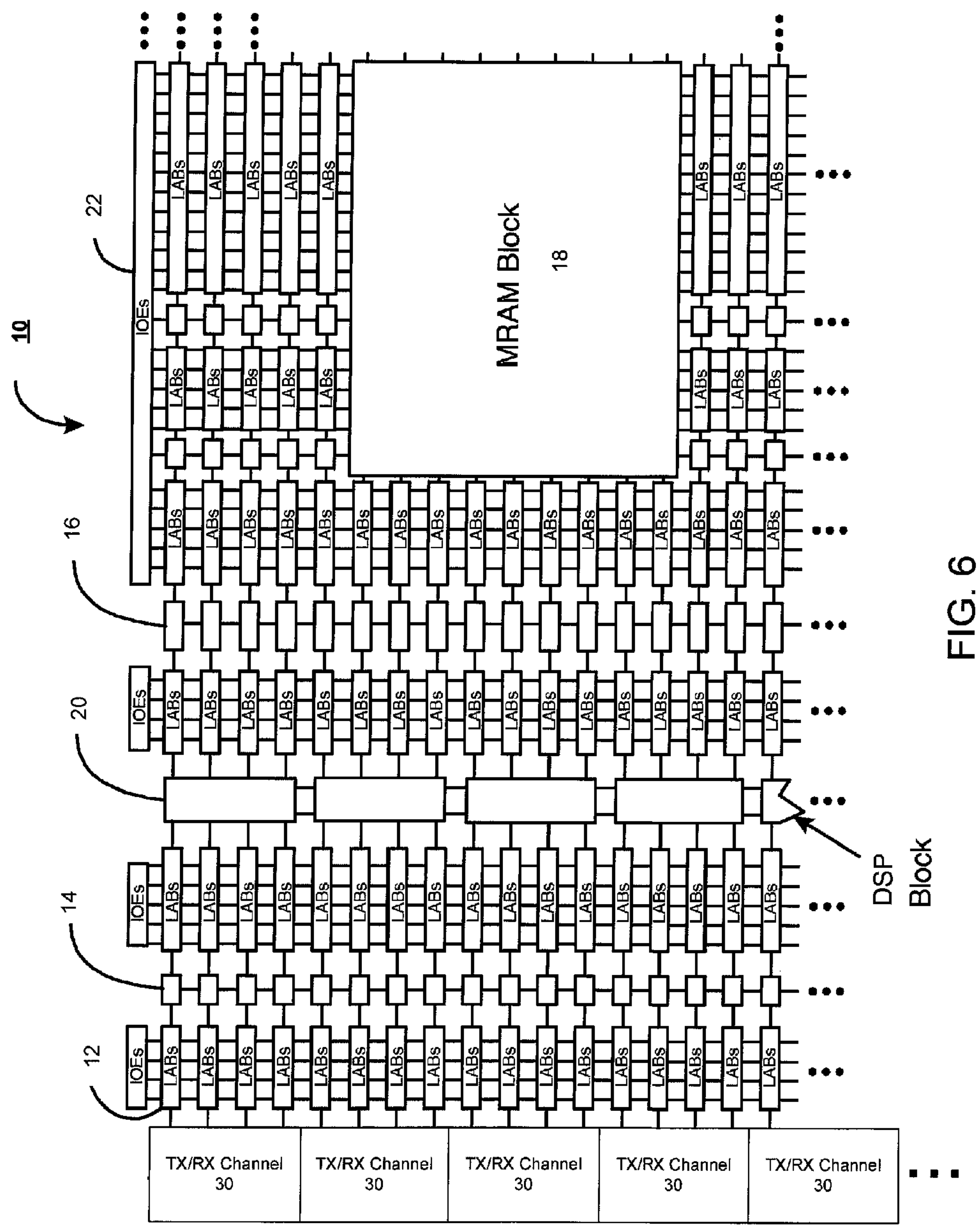
FIG. 6 is a simplified partial block diagram of a field programmable gate array (FPGA) that can include aspects of the present invention.

FIG. 6 is a simplified partial block diagram of a field programmable gate array (FPGA) 10 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, the receiver circuitry described herein.

It is to be understood that FPGA 10 is described herein for illustrative purposes only and that the present invention can be implemented in many different types of PLDs, FPGAs, and ASICs.

Figure 7:
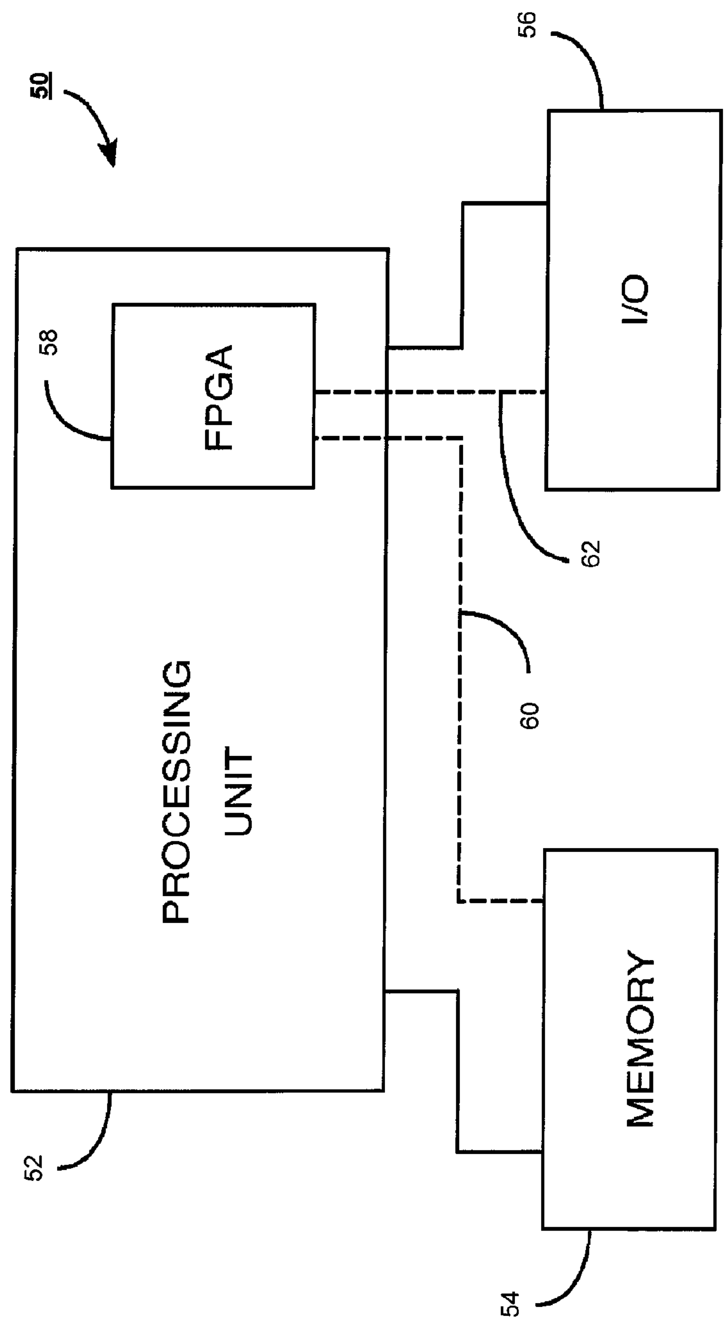
FIG. 7 is a block diagram of an exemplary digital system that can employ techniques of the present invention.

The present invention can also be implemented in a system that has a FPGA as one of several components. FIG. 7 shows a block diagram of an exemplary digital system 50 that can embody techniques of the present invention. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A clock and data recovery circuit comprising:

a sampler circuit arranged to receive a data signal and a sampling clock and generate a feedback signal which is responsive to a phase of the data signal relative to the sampling clock signal;

a de-multiplexer circuit arranged to de-multiplex the feedback signal and output a de-multiplexed feedback signal;

a voting circuit arranged to decimate the de-multiplexed feedback signal and output a decimated feedback signal;

a digital filter circuit arranged to filter the decimated feedback signal from the voting circuit and to output a filtered feedback signal;

a finite state machine circuit arranged to receive the filtered feedback signal and generate an interpolator control signal; and a phase interpolator circuit arranged to generate the sampling clock responsive to a reference clock and the interpolator control signal, wherein the de-multiplexer circuit comprises higher-speed circuit blocks which are arranged to receive the feedback signal and lower-speed circuit blocks which are arranged to output the de-multiplexed feedback signal.

2. The clock and data recovery circuit of claim 1, wherein the sampler and the phase interpolator circuits operate at a higher speed while the voting and finite state machine circuits operate at a slower speed.

3. The clock and data recovery circuit of claim 1, wherein the feedback signal comprises an early signal indicating that the sampling clock is leading the data signal and a late signal indicating that the sampling clock is lagging the data signal.

4. The clock and data recovery circuit of claim 3, wherein the de-multiplexer circuit includes a first sub-circuit to de-multiplex the early signal and a second sub-circuit to de-multiplex the late signal.

5. The clock and data recovery circuit of claim 1, wherein the de-multiplexer circuit is programmable to a plurality of de-multiplexing settings.

6. The clock and data recovery circuit of claim 5, wherein the voting circuit comprises a majority voting circuit with a plurality of programmable settings for at least one of the de-multiplexer settings.

7. The clock and data recovery circuit of claim 1, wherein the digital filter is programmable to a plurality of filter settings.

8. A method for clock and data recovery from a data signal, the method comprising:

generating a feedback signal which is responsive to a phase of a data signal relative to a sampling clock signal;

de-multiplexing the feedback signal to generate a de-multiplexed feedback signal;

decimating the de-multiplexed feedback signal to generate a decimated feedback signal;

filtering the decimated feedback signal to generate a filtered feedback signal;

generating an interpolator control signal using the filtered feedback signal and a finite state machine; and generating the sampling clock by interpolation using a reference clock and the interpolator control signal, wherein the de-multiplexing is performed by higher-speed circuit blocks which are arranged to receive the feedback signal and lower-speed circuit blocks which are arranged to output the de-multiplexed feedback signal.

9. The method of claim 8, wherein the feedback signal and the sampling clock are generated by circuitry operating at a higher speed, while the decimated feedback signal, the filtered feedback signal, and interpolator control signal are generated by circuitry operating at a lower speed.

10. The method of claim 8, wherein the feedback signal comprises an early signal indicating that the sampling clock is leading the data signal and a late signal indicating that the sampling clock is lagging the data signal.

11. The method of claim 10, wherein the early and late signals are each de-multiplexed by a 1:N de-multiplexer, wherein N is programmable to one of a plurality of numbers.

12. The method of claim 11, wherein the decimating is performed by a majority voting circuit which is programmable to one of a plurality of settings.

13. The method of claim 12, wherein the filtering is performed by a digital filter circuit which is programmable to one of a plurality of settings.

14. A receiver for a data link, the receiver comprising:

a buffer circuit arranged to receive a data signal and generate a buffered data signal; and a programmable clock and data recovery circuit arranged to generate a sampling clock from the buffered data signal, the clock and data recovery circuit including a sampler arranged to generate a feedback signal which is responsive to a phase of the data signal relative to the sampling clock signal, a programmable de-multiplexer arranged to de-multiplex the feedback signal and output a de-multiplexed feedback signal, wherein the programmable de-multiplexer is configurable to a plurality of de-multiplexer settings, a programmable voting circuit arranged to decimate the de-multiplexed feedback signal and output a decimated feedback signal, wherein the voting circuit comprises a majority voting circuit with a plurality of programmable settings for at least one of the de-multiplexer settings, a digital filter arranged to filter the decimated feedback signal and output a filtered feedback signal, a finite state machine arranged to receive the filtered feedback signal and generate an interpolator control signal, and a phase interpolator arranged to generate the sampling clock responsive to a reference clock and the interpolator control signal.

15. The receiver of claim 14, wherein the programmable de-multiplexer comprises higher-speed circuit blocks which are arranged to receive the feedback signal and lower-speed circuit blocks which are arranged to output the de-multiplexed feedback signal.

16. The receiver circuit of claim 15, wherein the sampler and the phase interpolator operate at a higher speed while the voting circuit, digital filter, and finite state machine operate at a slower speed.

* * * * *